(12) United States Patent
Moran et al.

(10) Patent No.: US 9,354,270 B2
(45) Date of Patent: May 31, 2016

(54) STEP DRILL TEST STRUCTURE OF LAYER DEPTH SENSING ON PRINTED CIRCUIT BOARD

(71) Applicant: Oracle International Corporation, Redwood City, CA (US)

(72) Inventors: Stephanie Moran, San Francisco, CA (US); Michael C Freda, Morgan Hill, CA (US); Karl Sauter, Pleasanton, CA (US)

(73) Assignee: Oracle International Corporation, Redwood Shores, CA (US)

( * ) Notice: Subject to any disclaimer, the term of this patent is extended or adjusted under 35 U.S.C. 154(b) by 84 days.

(21) Appl. No.: 14/304,470

(22) Filed: Jun. 13, 2014

(65) Prior Publication Data
US 2015/0362547 A1 Dec. 17, 2015

(51) Int. Cl.
*H05K 3/02* (2006.01)
*G01R 31/28* (2006.01)
*H05K 1/11* (2006.01)
*G01R 27/02* (2006.01)
*H05K 3/00* (2006.01)
*G01B 7/26* (2006.01)

(52) U.S. Cl.
CPC ............. *G01R 31/2818* (2013.01); *G01B 7/26* (2013.01); *G01R 27/02* (2013.01); *H05K 1/116* (2013.01); *H05K 3/0047* (2013.01); *Y10T 29/49156* (2015.01); *Y10T 408/03* (2015.01)

(58) Field of Classification Search
CPC .................. G01R 31/2818; G01R 31/280128; G01R 7/026; G01R 7/023; G01R 7/02; G01R 27/02; G01R 27/00; H05K 1/116; H05K 1/115; H05K 1/11; H05K 3/0047; H05K 3/0044; Y10T 29/49004; Y10T 29/49002; Y10T 29/49124; Y10T 29/49117; Y10T 29/49156; Y10T 29/49155
USPC ................ 29/593, 592.1, 847, 846, 829, 825; 324/750.3, 754.07, 763.01, 158.1, 761, 324/537, 716, 158 R, 51, 65 R
See application file for complete search history.

(56) References Cited

U.S. PATENT DOCUMENTS

| 6,326,797 | B2 | 12/2001 | Caggiano et al. | |
|---|---|---|---|---|
| 7,669,321 | B1 * | 3/2010 | Levy | H05K 1/0268 174/260 |
| 7,676,920 | B2 * | 3/2010 | Farkas | H05K 1/0268 29/830 |
| 2007/0018752 | A1 * | 1/2007 | Miller | H05K 1/0219 333/33 |
| 2014/0093321 | A1 * | 4/2014 | Liu | H05K 3/42 408/1 R |

FOREIGN PATENT DOCUMENTS

EP 2280590 2/2011

* cited by examiner

*Primary Examiner* — Peter DungBa Vo
*Assistant Examiner* — Azm Parvez
(74) *Attorney, Agent, or Firm* — Meyertons Hood Kivlin Kowert & Goetzel; Erik A. Heter

(57) ABSTRACT

A step drill test structure for a PCB and method for using the same is disclosed. In one embodiment, a test structure includes a drill path and a connection via. The drill path may include sensing pads on selected ones of a plurality of layers of the PCB (e.g., the non-surface layers). The sensing pads of a given drill path may be electrically conductive, while the remaining portion of the drill path is non-conductive. The sensing pads of each drill path may be electrically coupled to the connection via. The depth of a given layer at a particular drill path may be determined by drilling, using an electrically conductive drill bit, into the drill path and determining when an electrical connection is made between the drill bit and the connection via.

6 Claims, 6 Drawing Sheets

STEP DRILL TEST STRUCTURE OF LAYER DEPTH SENSING ON PRINTED CIRCUIT BOARD

BACKGROUND

1. Technical Field

This disclosure relates to printed circuit boards (PCBs), and more particularly, to test structures used in PCB's and in coupons on PCB panels.

2. Description of the Related Art

PCBs are used to implement many electronic systems, such as computer systems. A typical PCB includes a number of conductive layers, with the conductive layers being separated from one another by layers of dielectric material. Some conductive layers may be dedicated to power or ground, while other conductive layers may be dedicated to the providing signal paths for connecting the various components to be mounted on the PCB.

Many PCBs may be initially manufactured with structures known as test coupons (or more simply, coupons). A coupon is a structure implemented in a PCB that may be used for some sort of testing during the manufacturing or post-manufacturing (but pre-operational) phase of the PCB. The coupons may thus be separate from the design of the board itself in terms of its operational function. In some cases, the coupons may be implemented on the PCB itself, while in other cases, a coupon may be implemented on a breakaway portion of a panel that is discarded after manufacturing, assembly and testing has been complete.

Coupons may be implemented for a wide variety of tests. For example, coupons may be implemented on a PCB (or breakaway structure attached thereto during manufacturing) for impedance testing, various electrical connection tests, and so on.

SUMMARY OF THE DISCLOSURE

A step drill test structure for a PCB and method for using the same is disclosed. In one embodiment, a test structure includes a plated through-hole via and a drill path. The drill path may include sensing pads along a z-axis on selected ones of a plurality of layers of the PCB (e.g., the non-surface layers). The sensing pads of a given drill path may be electrically conductive, while the remaining portion of the drill path is non-conductive. The through-hole via may be a ground via or other electrically conductive through-hole via. Each drill path may be electrically coupled to the through-hole via. The depth of a given layer at a particular drill path may be determined by drilling, using an electrically conductive drill bit, into the drill path and determining when an electrical connection is made between the drill bit and the through-hole via. Each step drill test structure may be significantly smaller than traditional test coupons that may be implemented on a PCB or PCB panel. Since the step drill test structures are relatively small, it may be incorporated into strategic locations on a PCB to provide critical layer depth information in close proximity to signal vias that are to be back-drilled.

In one embodiment, a method for determining depths of PCB layers may include making a first electrical connection to a connection via of a test structure, while drilling into a drill path of the coupon using an electrically conductive drill bit. The method further includes detecting when a first electrical connection is made. The detection of the first electrical connection is indicative of the drill bit making physical (and thus, electrical) contact with the first sensing pad. Drilling may be paused when the first electrical connection is made, and the depth of the layer corresponding to the sensing pad may be recorded.

After the depth (e.g., position along the z-axis) of the first layer is recorded, the depth of any additional sub-surface layers may subsequently be determined. Prior to determining the depth of a next layer after the first, the electrical connection between the first pad and the through-hole via is severed. For example, if a trace connecting the first sensing pad to the through-hole via, the through-hole via may be drilled down to the depth of the same layer, removing conductive material therein and thus severing the electrical connection between the first sensing pad and the through-hole via. The drill path may then be subsequently drilled into until an electrical connection is established between the next sensing pad and the through-hole via. When the next electrical connection is established, drilling in the drill path may be stopped or paused while the depth of the next layer is recorded. This methodology may be repeated for each additional layer for which the depth is to be found. The methodology may also be performed in a number of different test structures, and thus a topographic map of each layer may be constructed based on recorded layer depths.

The information regarding recorded layer depths may be subsequently used for more accurate backdrilling of any plated through hole type on a PCB when required, including signal vias and press-fit compliant pin connector holes. Many signals may be conveyed from one layer to another on a signal via that also traverses along the z-axis of the board. However, some of the layers may not be traversed by a signal that is conveyed between layers. In such instances, it may be desirable to remove conductive material in the signal via for those layers that are not traversed (e.g., to remove portions of a signal via that may act as an antenna and negatively impact signal integrity). Backdrilling may be used to remove the non-essential portions of the signal via. The amount of conductive material removed may be based on the information regarding layer depths determined from the methodology described above. This may allow more non-essential conductive material to be removed from the signal via, without affecting the essential portion thereof, than might otherwise be possible in the absence of such information.

BRIEF DESCRIPTION OF THE DRAWINGS

Other aspects of the disclosure will become apparent upon reading the following detailed description and upon reference to the accompanying which are now described as follows.

Figure 1:
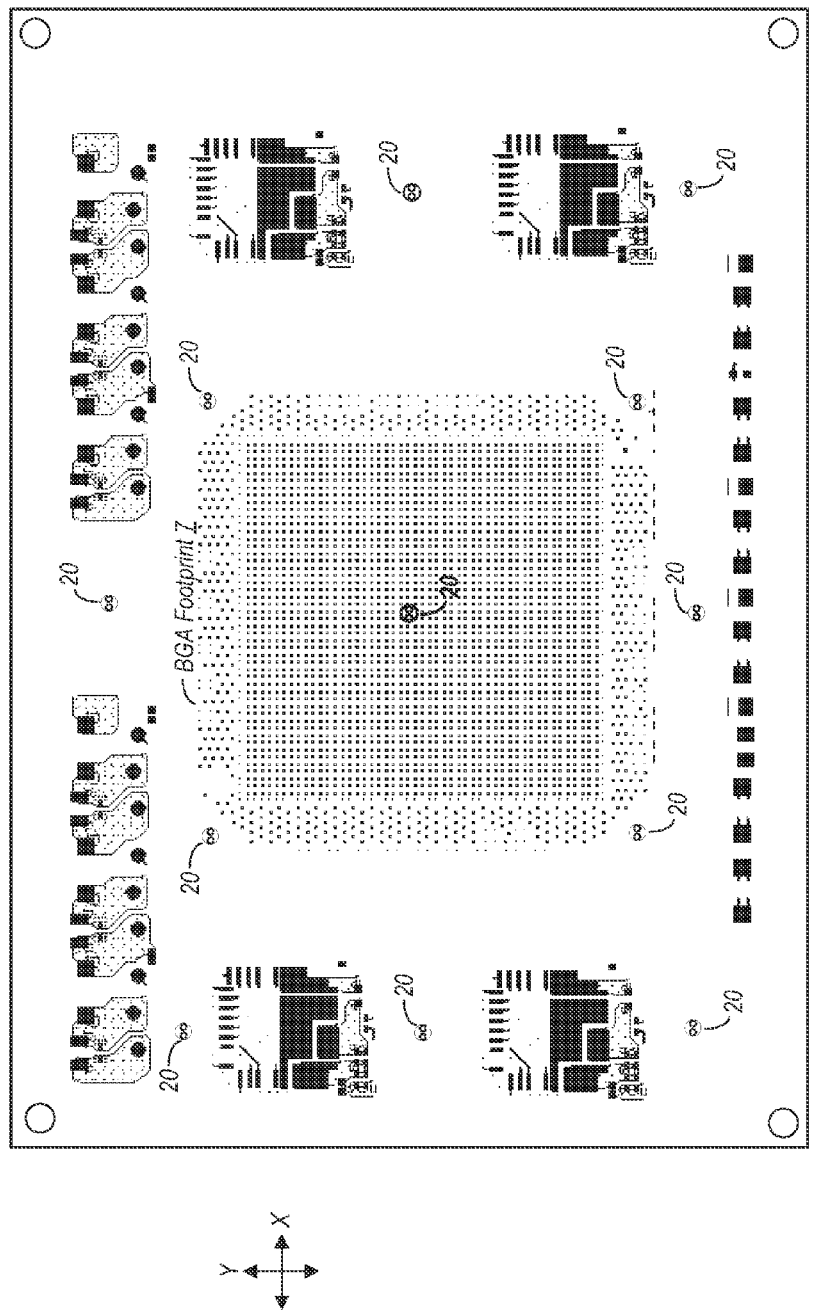
FIG. 1 is a top view of one embodiment of a PCB having a plurality of coupons used for determining layer depths.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph f, (or pre-AIA paragraph six) interpretation for that unit/circuit/component.

DETAILED DESCRIPTION

Turning now to FIG. 1, a top view of one embodiment of a printed circuit board (PCB) is shown. It is noted that the test structure and various methodologies discussed below may be used with a wide variety of PCB's, and thus the embodiment shown here is exemplary and not limiting.

In the embodiment shown, PCB 5 includes a number of patterns implemented thereon for surface mounting various components. Embodiments including plated through-holes for mounting of components are also possible and contemplated.

Among the included patterns for surface mounting of components is ball-grid array (BGA) footprint 7, which includes a number of pads for mounting a BGA. Although not explicitly shown here, PCB 5 may include a number of signal traces that may be used to convey signals between components or different pins of the same component. Signals may be conveyed on the surface layer that is shown, as well as on sub-surface layers that are not seen in this example. The subsurface layers may be conductive layers upon which signal traces, power planes, and/or ground planes may be implemented. The layers may be separated from one another by intervening layers of dielectric material.

Figure 2:
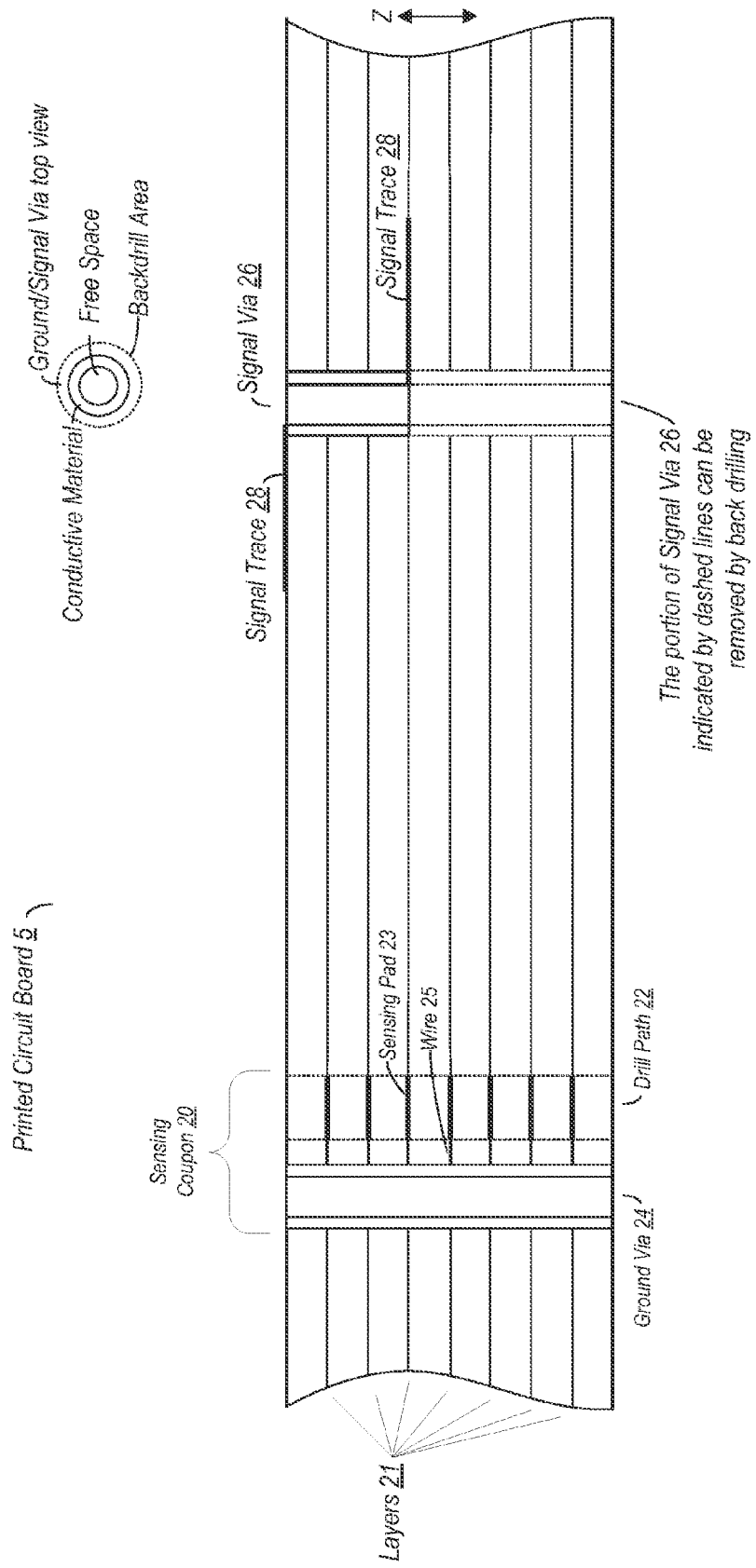
FIG. 2 is a side view of one embodiment of a PCB, illustrating a coupon and a signal via.

Signals may be conveyed between layers by signal vias, which may be implemented underneath various ones of the pads shown in the drawing, as well elsewhere on PCB 5. Signals conveyed on a given layer may traverse PCB 5 along the x- and/or y-axis as shown in FIG. 1. Signals conveyed between layers on through-hole vias may traverse PCB 5 along the z-axis, as shown in FIG. 2.

Signals that are conveyed between layers on PCB 5, using through-hole vias, may traverse some, but not all of the layers. This in turn may lead to signal integrity issues if the through-hole vias in question are otherwise left unaltered. In particular, an unused portion of a through-hole via may act as an antenna, and may thus render its corresponding signal path susceptible to electromagnetic interference (EMI). As such, it may be desirable to remove conductive portions of a through-hole via that are not used to convey signals between layers. This may be accomplished by a process known as backdrilling. After initial manufacture of a PCB, drilling may be performed on a PCB to remove some of the unused portions of a through-hole via that is otherwise used to convey signals between layers. In order to accomplish such drilling, the depths (i.e., position along the z-axis) of the layers used by the through-hole via are used as a guide to determine how much conductive material is to be removed.

In prior art methods of backdrilling, the depths to which a PCB is backdrilled may be determined by board specifications. In particular, each of the sub-surface layers may have a specified depth, and the depth of backdrilling for a particular through-hole via may be based on this specified depth. However, due to variations in the manufacturing process, materials used, and so forth, a significant amount of safety margin may be provided. This in turn may lead to substantially less conductive material being removed from a through-hole via than may otherwise be possible if the depth of the particular layers was known with greater precision. Consequently, the unremoved portions of the through-hole vias may still act as antennas.

In the embodiment shown, PCB 5 includes a number of test structures 20. The test structures 20 may be used to more accurately determine the depths of each of the sub-surface layers of PCB 5 to enable greater precision in backdrilling. Since PCB 5 includes a number of test structures 20, the depths of each subsurface layer may be determined at a number of different x-y coordinates along the board. From this information, topographic maps of each layer may be generated.

Each test structure 20 in the embodiment shown includes a connection via (or 'through-hole via' or simply 'via') 24 and a drill path 22. Through-hole via 24 may have conductive material extending between the two surface layers of PCB 5. In one embodiment, through-hole via 24 is a ground via, and may thus also be coupled to a ground plane within the board. However, through-hole via 24 is not restricted to being a ground via, and thus embodiments where through-hole via 24 is not electrically coupled to ground are possible and contemplated. Drill path 22 may include sensing pads made of conductive material on each subsurface layer, but may otherwise be devoid of conductive material (i.e. between the layers). Each sensing pad 23 may be electrically connected to the through-hole via 24 of its corresponding test structure 20. As will be discussed further below, this may enable the use of electrically conductive drill bits to detect when a drill has made physical contact with a sense pad, and thereby enable the depth of the corresponding layer at that particular test structure to be determined with greater precision.

FIG. 2 is a side view of one embodiment of a PCB, illustrating a test structure and a signal via. In the embodiment shown, PCB 5 includes a number of subsurface layers 21, a test structure 20, and a signal via 26. It is noted that a PCB may include a number of test structures 20 and a number of signal vias 26, and thus only one instance of each is shown here for the sake of simplicity. It is also noted that the number of layers 21 shown here is just as an example, and other embodiments of PCB 5 may have as many or few layers as is desired and may be feasibly implemented.

Test structure 20 includes a through-hole via 24 and a drill path 22. Through-hole via 24 in the embodiment shown includes an electrically conductive material that extends along the z-axis of PCB 5 between the surface layers with no breaks therein. Signal via 26, as originally constructed during the manufacture of PCB 5 (and thus, prior to backdrilling), may be configured in largely the same manner. Drill path 22 may include a number of sensing pads 23 each made of an electrically conductive material. However, between the layers, no conductive material is present in drill path 22. Each sensing pad 23 in the embodiment shown is physically and electrically coupled to conductive material in through-hole via 24. Accordingly, it is possible to make an electrical connection between a sensing pad 23 and through-hole via 24. A given sensing pad 23 may be substantially co-planer with the layer 21 in which it is implemented. Thus, the ability to make an electrical connection between a given sensing pad 23 and through-hole via 24 may be used to determine the depths of the various layers 21 at test structure 20, as is discussed in further detail below.

Signal via 26 in the embodiment shown is coupled to a signal trace 28. It is noted that signal trace 28 may be extend further than is shown here, and the portions shown are for the sake of illustration. A portion of signal trace 28 is implemented on the upper surface of PCB 5, while another portion is implemented on one of the subsurface layers 21. The signal may be conveyed on signal trace 28 between its surface and subsurface portions by signal via 26. As shown in the drawing, only a portion (indicated by solid lines) of signal via 26 is used to couple the surface portion of signal trace 28 to its corresponding sub-surface portion. The remainder of signal via 26, as indicated by dashed lines, is unused. If left unaltered, this portion of via 26 may absorb energy from signal transmissions, and this energy may be returned as noise. In some instances, the unused portion of signal via 26 may act as an antenna which can introduce interference onto signal trace 28 through EMI. Accordingly, it is desirable to remove the conductive material of this portion of signal via 26 in order to minimize these potential problems. An example of the amount of conductive material that may be removed along the horizontal axis of a given layer is shown by the outer dashed line indicated as "Backdrill Area." This backdrill area has a diameter that is greater than that of the through-hole via in order to ensure that all conductive material is completely removed to the required depth within the plated-through hole when backdrilled. The amount of conductive material that may be safely removed along the vertical axis by backdrilling may be limited by the knowledge of the depth of the layer to which the material is to be removed. In the prior art, such backdrilling was based on specified depths of the layers, which can vary from one instance of a PCB to the next. As such, a substantial amount of safety margin was provided for when backdrilling signal vias such as that shown here. This in turn left more unused signal via in PCB, and thus a larger potential antenna for introducing interference into a correspondingly couple signal trace. However, using test structure 20, the depths of individual layers 21 may be determined with greater precision, which may in turn allow the safe removal of more conductive material from a through-hole via than might otherwise be possible.

Figure 3:
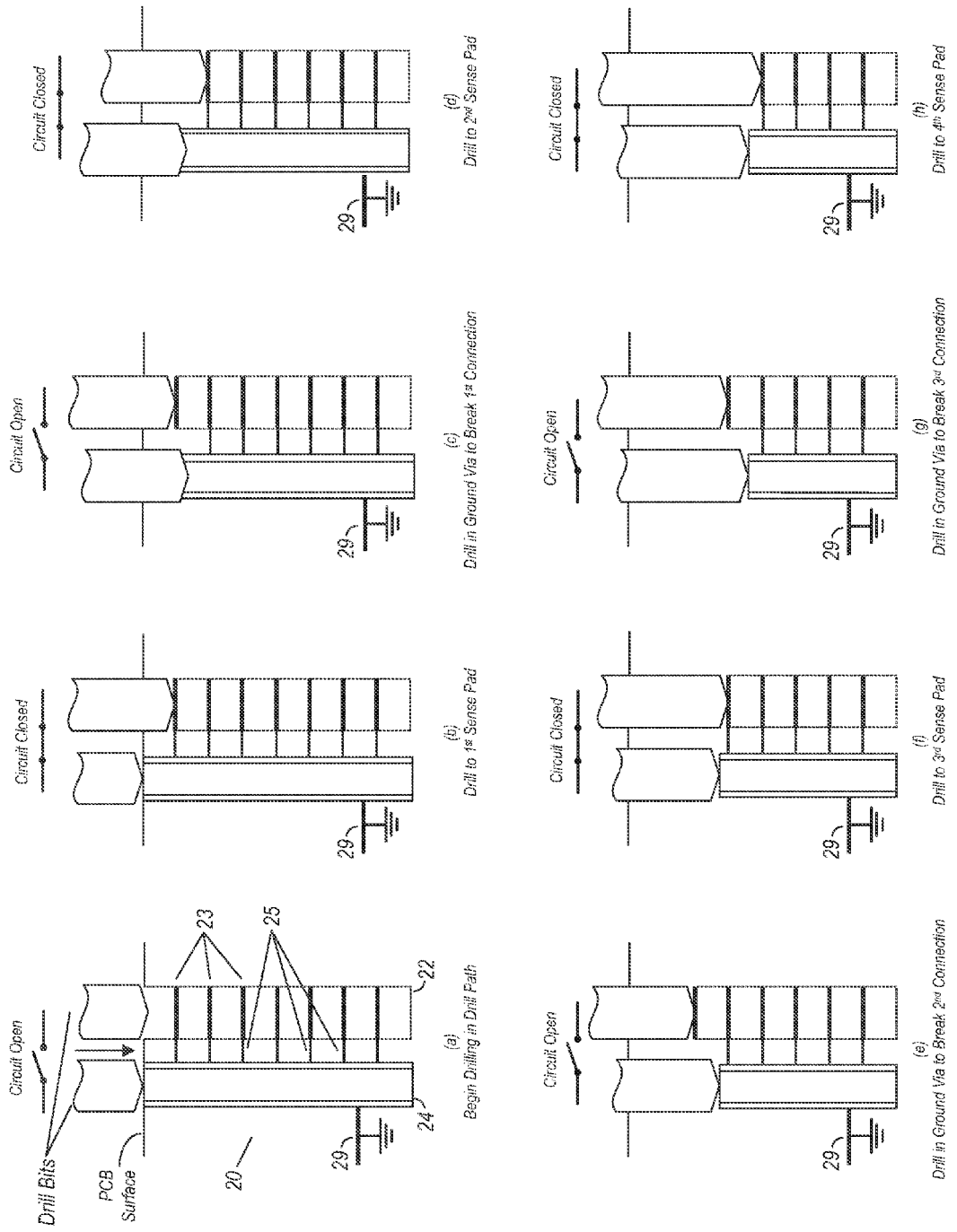
FIG. 3 is a drawing illustrating one embodiment of a method for determining depths of sub-surface layers in a PCB using a coupon.

FIG. 3 is a drawing illustrating one embodiment of a method for determining depths of sub-surface layers in a PCB using embodiments of a test structure 20. In the illustrated example, a first electrically conductive drill bit is coupled to drill path 22, while a second electrically conductive drill bit is coupled to through-hole via 24. Through-hole via 24 in this particular embodiment is a ground via and is thus coupled to a ground plane 29. Although not shown here, the drilling equipment may be configured to indicate when an electrical connection is present between these two drill bits. Moreover, the equipment may be configured to cause the drilling of drill path to be pause responsive to detecting an electrical connection between the two drill bits while the depth of a corresponding layer is recorded. It is noted that the configuration using two drill bits is used here for exemplary purposes, although this is not a requirement for performing the methodology discussed herein. In some embodiments, only a single drill bit is used, with the electrical connection formed using other methodologies (e.g., use of an electrically conductive machine top table, clamp at the end of the panel, etc.). The scope of this disclosure is intended to cover all such embodiments.

In (a), both of the drill bits have been connected to their respective through-hole vias. However, since the drill bit in drill path 22 is not yet in physical contact with any conductive material, there is no electrical connection to the other drill bit, as indicated by the "circuit open" symbol above. Thereafter, drilling into drill path 22 is commenced, and continues until physical contact is made with a sensing pad 23, as shown in (b). Once physical contact is made with the first sensing pad 23, an electrical connection is made between the two drill bits, as indicated by the "circuit closed" symbol. Once the electrical connection is detected, drilling in drill path 22 is paused and the depth of the first layer is recorded.

After recording the depth of the first layer, drilling may commence in through-hole via 24 in order to remove conductive material therefrom, as shown in (c). Drilling may be conducted at least until the electrical connection is severed, which in this case may occur when drilling in through-hole via 24 removes enough conductive material that the connection to the first sensing pad is severed by the breaking of a wire 25 coupled therebetween. It is noted that the wire 25 is implemented on the same layer as the first sensing pad in this embodiment. Thus, drilling in the through-hole via may be conducted down to the first layer and a sufficient amount thereafter to sever the electrical connection.

After drilling in through-hole via 24 has successfully severed the electrical connection between the two drill bits, drilling may pause in through-hole via 24 and re-commence in drill path 22. The drilling in drill path 22 may continue until physical contact is made with the second sensing pad 23, thereby re-establishing the electrical connection (d). Drilling in the drill path is then paused and the depth of the second layer is recorded. The process may then repeat itself for a number of layers, e.g., breaking the electrical connection in (e), re-establishing the connection in (f) and recording the depth of the next layer, and so forth in (g) and (h). The process may repeat itself for as many layers as necessary or desired. Using this methodology, the depth of each layer, at that particular test structure 20, may be determined and recorded.

It is noted that the embodiment discussed above is not intended to be limiting. In another embodiment, only a single drill bit is used, in drill path 22. A probe or other electrically conductive device may make electrical contact with the through-hole via to close the electrical connection. The electrical connection through wire 25 may be severed by the drill bit used in drill path 22. In such an embodiment, no electrical connection is needed, and coupons that do not require a ground (or other through-hole via) in close proximity to the drill path may be implemented.

Figure 4:
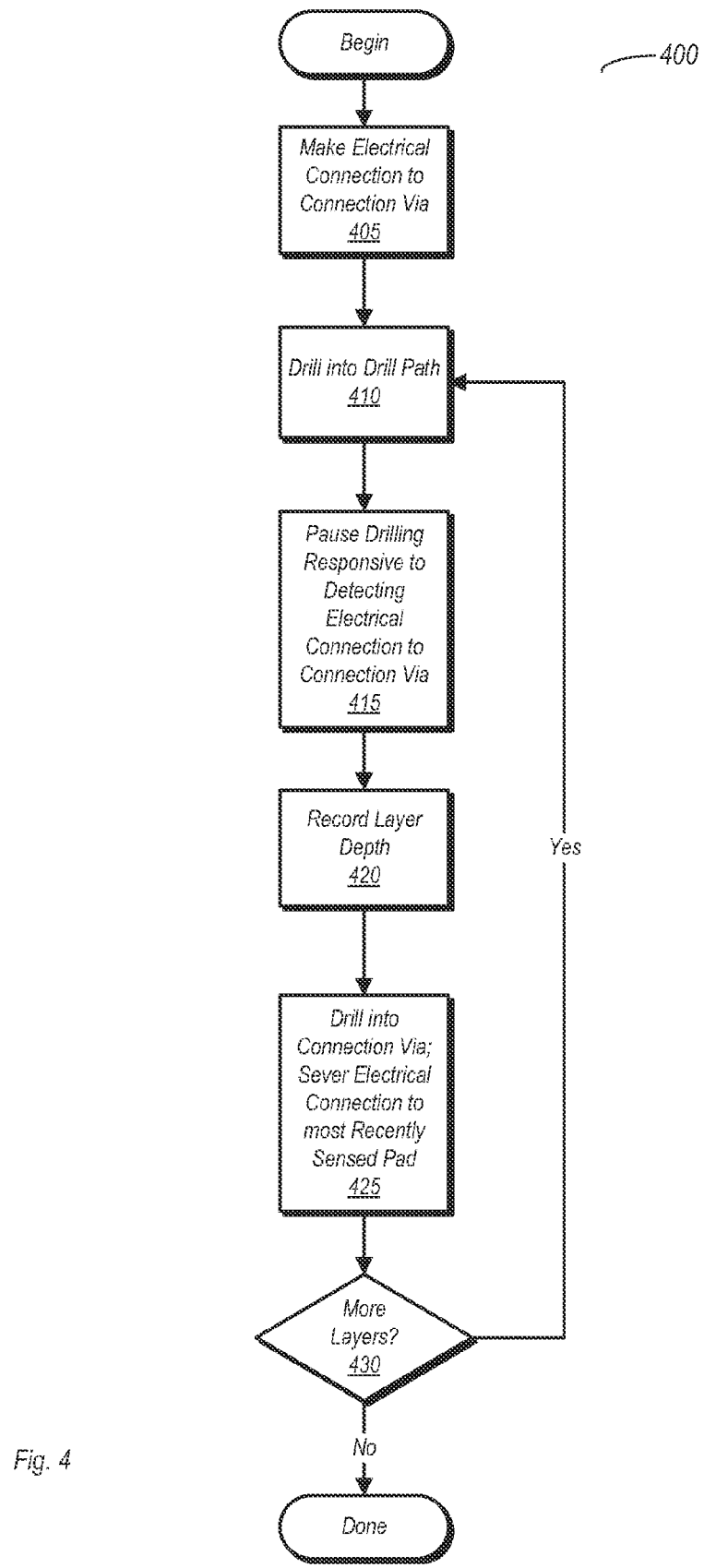
FIG. 4 is a flow diagram illustrating one embodiment of a method for determining layer depths using a coupon in a PCB.

FIG. 4 is a flow diagram illustrating one embodiment of a method for determining layer depths using a coupon in a PCB. Method 400 may be performed using various embodiments of a PCB and a test structure as described above. Additionally, method 400 may also be performed on variations of a PCB and test structure that are not explicitly disclosed herein, but otherwise fall within the scope of this disclosure.

Method 400 begins with the making of an electrical connection to a connection via of a test structure (block 405), which may be accomplished by, e.g., coupling an electrically conductive drill bit thereto. The connection via may be a ground via (i.e. coupled to ground) in one embodiment, although this is not a requirement for all embodiments. Other ways of making and electrical connection to the through-hole via may include coupling a probe thereto, or coupling a probe to a portion of a ground plane to which the ground via is electrically coupled in an embodiment where the through-hole via is a ground via.

Once the electrical connection to the through-hole via has been made, method 400 continues with the drilling into a drill path (410) of a test structure (e.g., such as the one described above). The drilling may be performed using a drill bit that is electrically conductive. Drilling may continue until an electrical connection to the through-hole via (or a ground plane if the through-hole via is a ground via) is detected, upon which drilling is then paused (block 415). The electrical connection may be detected responsive to the drill bit making contact with an electrically conductive sensing pad in the drill path. Responsive to detecting the electrical connection and pausing the drilling of the drill path, the depth of the layer of the sensing pad may be recorded (block 420).

After recording the depth of the layer upon which the sensing pad is implemented, the method may then proceed by drilling into the through-hole via to remove electrically conductive material until the connection to the most recently sensed pad is severed (block 425). If there are more layers for which the depth is to be determined (block 430, yes), then the method returns to block 410 and repeats the sequence. Otherwise (block 430, no), the method is complete for that particular test structure.

Figure 5:
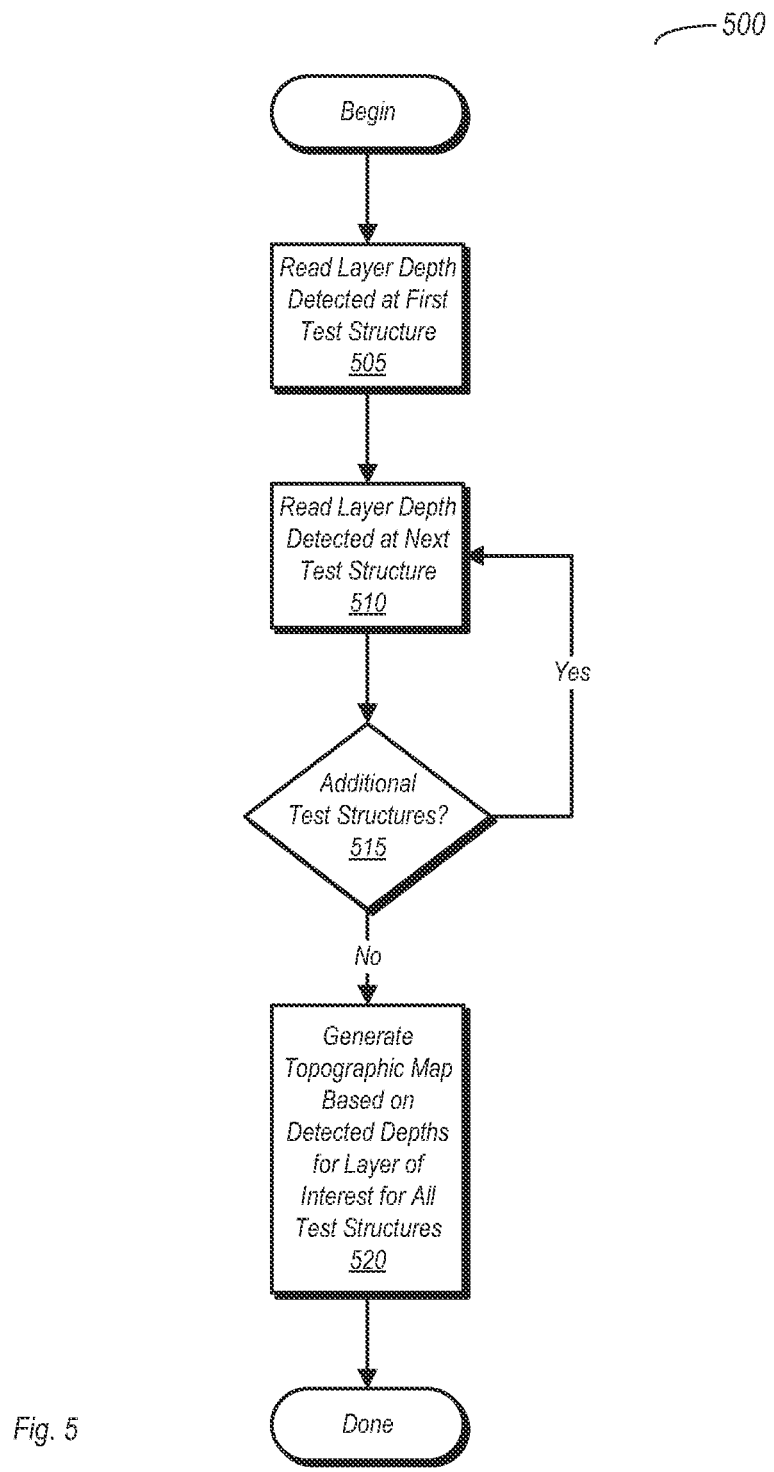
FIG. 5 is a flow diagram illustrating one embodiment of a method for constructing a topographic map of layer depths for one or more sub-surface layers of a PCB.

Moving now to FIG. 5, a flow diagram illustrating one embodiment of a method for constructing a topographic map of a given layer of a PCB. Method 500 assumes that method 400 discussed above, or variation thereof, has been performed for a number of test structures on a PCB, thereby providing data regarding layer depths at a number of different points on the board.

Method 500 begins with the reading of a layer depth detected at a first coupon (block 505). Thereafter, the layer depth detected at a next coupon is read (block 510). If layer depth data is present for one or more additional coupons (block 515, yes), the method returns to block 510, and may repeat this cycle until layer depth data for the layer in question has been read for all coupons for which it was detected. Once there are no more additional coupons for which layer depth data was detected, a topographic map may be generated based on the detected depths of the layer of interest for all coupons for which data was gathered (block 520). For areas that lie between coupons (and thus, where layer depths were not directly measured), the layer depths may be extrapolated based on data from nearby coupons.

Figure 6:
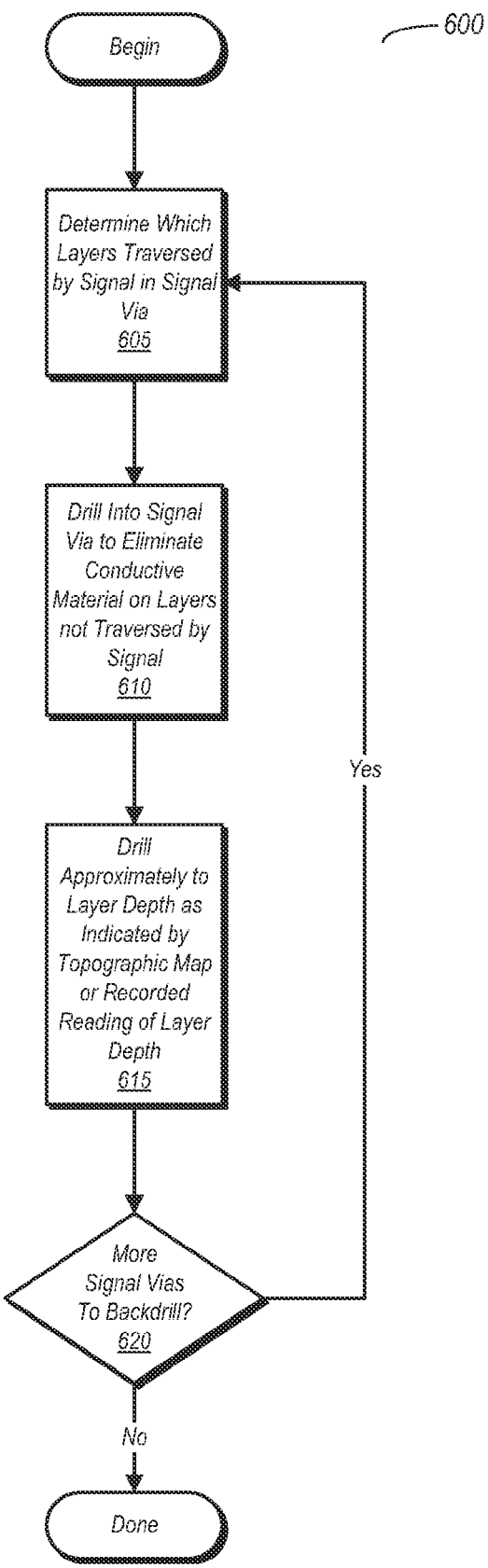
FIG. 6 is a flow diagram illustrating one embodiment of a method for backdrilling signal vias in a PCB.

FIG. 6 is a flow diagram illustrating one embodiment of a method for backdrilling signal vias in a PCB using layer depth data determined from embodiments of the various methodologies discussed above. Method 600 begins with the determination of which layers are traversed by a signal conveyed on a signal via of interest (block 605). Thereafter, drilling into the signal via may be performed to remove conductive material within the through-hole via at layers that are not traversed by the signal (block 610). Using layer depth data generated from use of the coupons described above and the methods for using them, a greater amount of conductive material may be removed than would otherwise be possible. Thus, less of a stub remains for retaining and releasing signal energy. Furthermore, the size of any antenna produced by any unused portion of the signal via may be minimized. Thus, drilling may be performed to approximately the layer depth indicated by a topographic map or other recorded data of the last layer which the signal traverses (block 615). The drilling may stop just short of this layer so as to not remove any desired conductive material from the target signal via. If there are more signal vias to backdrill (block 620, yes), the method returns to block 605 and repeats for the next through-hole via. Otherwise (block 620, no), the method is completed.

It is noted that while the discussion above has been directed to sensing coupons on a PCB, the disclosure is not necessarily limited to such embodiments. Further embodiments are possible and contemplated in which a panel of multiple PCBs includes additional coupons between the actual PCBs. The use of additional sensing coupons can provide additional working panel location and layer depth information for backdrilling.

Numerous variations and modifications will become apparent to those skilled in the art once the above disclosure is fully appreciated. It is intended that the following claims be interpreted to embrace all such variations and modifications.

What is claimed is:

1. A method comprising:

drilling into a drill path, on a printed circuit board (PCB);

detecting a first electrical connection between a through-hole via and a drill bit drilling into the drill path, wherein detecting the electrical connection indicates that the drill bit has made contact with a first conductive pad on a first layer of the PCB;

recording a depth of the first layer;

generating topographic maps for each of a plurality of layers of the PCB including the PCB, including the first layer;

removing conductive material in selected through-hole vias between a surface of the PCB and corresponding selected ones of the plurality of layers, wherein an amount of conductive material removed in a given one of the selected through-hole vias is based in part on a topographic map of a corresponding selected layer.

2. The method as recited in claim 1, further comprising:

breaking the electrical connection between the first conductive pad and the through-hole via;

continuing said drilling into the drill path;

detecting a second electrical connection between the through-hole via and the drill bit, the second electrical connection indicating that the drill bit has made contact with a second conductive pad on a second layer of the PCB;

recording a depth of the second layer of the PCB.

3. The method as recited in claim 2, further comprising:

repeating said drilling, said detecting, and said recording for one or more additional layers of the PCB; and repeating said breaking an electrical connection for each of the additional layers of the PCB.

4. The method as recited in claim 2, wherein breaking the electrical connection comprises drilling into the through-hole via.

5. The method as recited in claim 1, wherein the drill path and the through-hole via form a first coupon in the PCB, and wherein the through-hole via is a ground via electrically coupled to at least one ground plane in the PCB.

6. The method as recited in claim 5, wherein the PCB includes a plurality of coupons including the first coupon, wherein each of the plurality of coupons includes a ground via and drill path, wherein the drill path includes, on each of a subset of a plurality of layers of the PCB, a corresponding sensing pad that is electrically coupled to the ground via.

* * * * *